United States Patent
Sasaki et al.

[19]

[11] Patent Number: 5,962,953
[45] Date of Patent: Oct. 5, 1999

[54] PIEZOELECTRIC TRANSFORMER WITH MONITOR ELECTRODES FOR SENSING UNBALANCED VIBRATION OF THE TRANSFORMER

[75] Inventors: Hiroshi Sasaki; Kouichi Iguchi, both of Tokyo, Japan

[73] Assignee: NEC Corporation, Tokyo, Japan

[21] Appl. No.: 08/902,038

[22] Filed: Jul. 29, 1997

[30] Foreign Application Priority Data

Jul. 31, 1996 [JP] Japan ................................. 8-202453

[51] Int. Cl.⁶ ........................ H01L 41/04; H01L 41/08
[52] U.S. Cl. .................... 310/359; 310/316; 310/366
[58] Field of Search ............................ 310/316, 359, 310/366, 365

[56] References Cited

U.S. PATENT DOCUMENTS

| | | | |
|---|---|---|---|
| 5,420,548 | 5/1995 | Nakajima | 310/366 |
| 5,463,266 | 10/1995 | Fuuoka et al. | 310/359 |
| 5,654,605 | 8/1997 | Kawashima | 310/316 |
| 5,701,049 | 12/1997 | Kanayama et al. | 310/359 |
| 5,705,877 | 1/1998 | Shimada | 310/318 |
| 5,705,879 | 1/1998 | Abe et al. | 310/359 |
| 5,818,150 | 10/1998 | Yamamoto et al. | 310/359 |

FOREIGN PATENT DOCUMENTS

| | | | |
|---|---|---|---|
| 50-99449 | 8/1975 | Japan . | |
| 4-4769 | 1/1992 | Japan . | |
| 4-172975 | 6/1992 | Japan | 310/316 |
| 6-177451 | 6/1994 | Japan . | |
| 8-107678 | 4/1996 | Japan . | |
| 0646392 | 2/1979 | Russian Federation | 310/316 |

*Primary Examiner*—Clayton LaBalle
*Attorney, Agent, or Firm*—Young & Thompson

[57] ABSTRACT

A piezoelectric transformer includes at least a pair of monitor electrodes for monitoring unbalanced vibration of the piezoelectric element. The transformer also has a plurality of input electrodes for a transformer input signal and a pair of output electrodes for a transformer output signal. While driven by the input signal to produce the output signal, the piezoelectric transformer produces a pair of monitor signal components at the monitor electrodes to individually indicate vibration components produced in the piezoelectric transformer collectively as a state of unbalanced operation of the transformer.

14 Claims, 7 Drawing Sheets

PIEZOELECTRIC TRANSFORMER WITH MONITOR ELECTRODES FOR SENSING UNBALANCED VIBRATION OF THE TRANSFORMER

BACKGROUND OF THE INVENTION

This invention relates to a Rosen type piezoelectric transformer of the type proposed by R. A. Rosen.

In the manner which will later be exemplified with reference to the accompanying drawing, a conventional piezoelectric transformer comprises according to Rosen a thin piezoelectric element or plate which is made of a piezoelectric material, such as lead titanate zirconate (PTZ) and is typically rectangular in top view having a lengthwise direction, a widthwise direction, and a thickness direction orthogonal to each other. In general, a plurality of power electrodes are formed on the piezoelectric plate to provide a driver portion and a generator portion of the piezoelectric transformer with one and the other of the driver and the generator portions subjected to polarization in the lengthwise and the thickness directions.

In operation, a pair of the power electrodes on the driver portion are used as input electrodes. Another pair of the power electrodes are used as output electrodes usually with only one of the output electrodes placed on the generator portion and with another of the power electrodes used in common as one each of the input and the output electrodes. When driven by a transformer input signal supplied across the input electrodes, the piezoelectric transformer produces a transformer output signal across the output electrodes. Besides a few novel piezoelectric transformers, such conventional piezoelectric transformers are described in Japanese Patent Prepublication (A) No. 177,451 of 1994. The piezoelectric transformers are operable either in a first order Rosen type mode of vibration or in a third order Rosen type with an additional pair of input electrodes formed on the piezoelectric element.

More specifically, the transformer input signal excites a mechanical vibration in a direction of the polarization of the driver portion as a result of the piezoelectric effect when the transformer input signal has an input or drive frequency resonant with the mechanical vibration. The generator portion converts mechanical energy of the mechanical vibration to electric energy by its piezoelectric effect and produces the transformer output signal at the drive frequency.

The piezoelectric transformer is compact and has a thin thickness to be very convenient for use in energizing a cold cathode-ray tube to provide backlight of a liquid crystal display unit. The piezoelectric transformer may, however, produce the transformer output signal with an excessive output voltage beyond a predetermined output voltage, such as 2 kV, to damage the piezoelectric element. In order to avoid production of such an excessive output voltage, an improved driving circuit is disclosed in Japanese Patent Prepublication (A) No. 167,678 of 1996 for the conventional piezoelectric transformer.

Other than in the piezoelectric transformer, a piezoelectric element is used in various other applications. In Japanese Patent Prepublication (A) No. 4,769 of 1992, an ultrasonic motor is revealed. In the ultrasonic motor, a rotor is made of the piezoelectric material. A monitor electrode is attached to the rotor to detect an abnormal vibration of the rotor and thereby to control a driving signal supplied to the ultrasonic motor. For detection, the abnormal vibration must, however, be in a predetermined frequency range dependent on an electrode size.

In the manner described above, it has been known that damage, such as a crack, is caused to the piezoelectric transformer when the transformer output signal undesiredly has an excessive output voltage. The damage disturbs normal or homogeneous vibration of the piezoelectric element generating heat and reducing efficiency of the piezoelectric transformer. The inventors of the present invention have confirmed that such damage is caused also when the piezoelectric element is subjected to an abnormal vibration other than the normal vibration. The abnormal vibration has not been detected in the piezoelectric transformer.

It should be noted in connection with the foregoing that the conventional piezoelectric transformer has only one of the transformer output electrodes independently of the transformer input electrodes. Incidentally, the present inventors have confirmed that the abnormal vibration gives rise to an unbalance of vibration in the widthwise direction and that the unbalance occurs in the vibration in a direction parallel or orthogonal to polarization of the generator portion in the piezoelectric transformer operable in the vibration mode of the first order Rosen type and at an interface where the polarization of the generator portion is opposite in the piezoelectric transformer operable in the vibration mode of the third order Rosen type.

SUMMARY OF THE INVENTION

It is consequently a principal object of the present invention to provide a piezoelectric transformer which is of the Rosen type and in which it is possible to detect an abnormal vibration.

It is another principal object of this invention to provide a piezoelectric transformer which is of the type described and in which it is possible to detect an unbalance in vibration excited therein.

It is still another principal object of this invention to provide a piezoelectric transformer which is of the type described and for which it is possible to detect a crack undesiredly produced by the unbalance in a piezoelectric element thereof.

It is yet another principal object of this invention to provide a piezoelectric transformer which is of the type described and for which it is possible to detect generation of heat by the crack and detect a resulting deterioration in efficiency thereof.

It is a subordinate object of this invention to provide a piezoelectric transformer which is of the type described to comprise a piezoelectric element having a lengthwise and a thickness direction, a plurality of input terminals spaced from each other in the thickness direction, and a pair of output electrodes with one of the output electrodes used in common as one of the input electrodes and with the other of the output electrodes spaced from the input electrodes for excitation of a normal vibration of a first order Rosen type and in which it is possible to detect an unbalance produced in the vibration in the lengthwise direction.

It is another subordinate object of this invention to provide a piezoelectric transformer which is of the type described to comprise a piezoelectric element having a lengthwise and a thickness direction, a plurality of input electrodes spaced from each other in the thickness direction and in the lengthwise direction, and a pair of output electrodes with one of the output electrodes used in common as one of the input electrodes and with the other of the output electrodes spaced from the input electrodes for excitation of a normal vibration of a third order Rosen type and in which it is possible to detect an unbalance produced in the lengthwise direction at an interface of the piezoelectric element passing through a central node of the normal vibration.

It is still another subordinate object of this invention to provide a piezoelectric transformer which is of the type described to comprise a piezoelectric element having a lengthwise, a widthwise, and a thickness direction, a plurality of input electrodes spaced from each other in the thickness direction, and a pair of output electrodes with one of the output electrodes used in common as one of the input electrodes and with the other of the output electrodes spaced from the input electrodes for excitation of a normal vibration of a first or a third order Rosen type and in which it is possible to detect an unbalance produced in the vibration in the widthwise direction.

It is a different principal object of this invention to provide a piezoelectric transformer which is of the type described and for which it is possible to make an abnormal operation detecting circuit detect an abnormal operation thereof.

It is another different object of this invention to provide, for a piezoelectric transformer comprising a piezoelectric element, a plurality of input and output electrodes for supplying a transformer input signal to the piezoelectric element and for getting a transformer output signal from the piezoelectric element, and a plurality of monitor electrodes for producing a monitor signal indicative of a state of operation of the piezoelectric transformer, an abnormal operation detecting circuit for detecting an abnormal state of operation of the piezoelectric transformer.

It is still another different object of this invention to provide an abnormal operation detecting circuit which is of the type described and can provide a warning when operation of the piezoelectric transformer is abnormal.

It is yet another different object of this invention to provide an abnormal operation detecting circuit which is of the type described and can insure security of a normal operation of the piezoelectric transformer and raise a reliability of the normal operation.

Other objects of this invention will become clear as the description proceeds.

In accordance with an aspect of this invention, there is provided a piezoelectric transformer comprising a piezoelectric element and a plurality of power electrodes on the piezoelectric element for use in subjecting the piezoelectric element to polarization, in driving the piezoelectric element by a transformer input signal, and in getting a transformer output signal, further comprising a plurality of monitor electrodes offset from the power electrodes on the piezoelectric element to monitor an abnormal operation of the piezoelectric transformer.

In accordance with a different aspect of this invention, there is provided an abnormal operation detecting circuit which is for a piezoelectric transformer comprising a plurality of input electrodes for a transformer input signal, a pair of output electrodes for a transformer output signal, and a plurality of monitor electrodes for individually producing monitor signal components collectively as a monitor signal indicative of a state of operation of the piezoelectric transformer and which comprises comparing means for comparing the monitor signal with a reference signal to produce a difference signal when the state of operation is objectionable.

DESCRIPTION OF PREFERRED EMBODIMENTS

Figure 1:
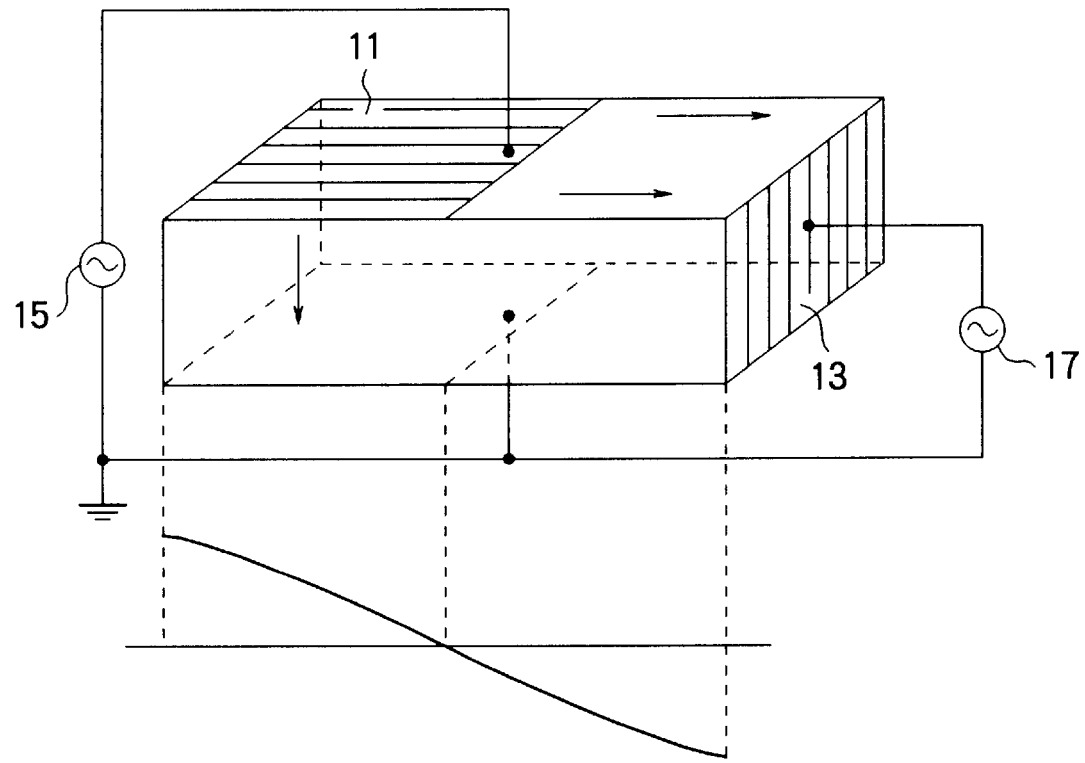
FIG. 1 schematically shows a perspective view of a conventional piezoelectric transformer together with a mode of vibration of a piezoelectric element thereof.

Referring to FIG. 1, a conventional piezoelectric transformer will first be described in order to facilitate an understanding of the present invention. The piezoelectric transformer is described in Japanese Patent Prepublication No. 177,451 of 1994 cited heretobefore and is of a first order Rosen type.

The piezoelectric transformer comprises a piezoelectric element or plate of a piezoelectric material, such as PTZ. In the example being illustrated, the piezoelectric element has a horizontal lengthwise direction, a widthwise direction orthogonal to the lengthwise direction, and a thickness direction orthogonal in a top-bottom direction to the lengthwise and the widthwise directions. The piezoelectric element has a front surface and a rear surface extending perpendicular to the widthwise direction.

A pair of input electrodes 11 are formed on a left half portion of the piezoelectric element spaced in the thickness direction by printing a conductor paste, such as a silver-palladium paste, and subsequently firing the paste printed on the piezoelectric element. A pair of output electrodes 13 are likewise formed with one of the output electrodes used in common as one of the input electrodes 11 and with the other of the output electrodes placed on a right-hand end surface as a selected output electrode in the manner indicated by the reference numeral 13. The common electrode is grounded.

Preferably using the input and the output electrodes 11 and 13 which are herein collectively called power electrodes, the piezoelectric element is preliminarily subjected to polarization. In the left half portion, the polarization has a polarization direction depicted by a downwardly directed arrow. In a right half portion, the polarization direction is from left to right as indicated by a pair of rightwardly directed arrows.

From a driving source 15, a transformer input signal is supplied across the input electrodes 11. Across the output electrodes 13, a transformer output signal of the driving frequency is developed for delivery to a load 17 which is depicted as an a.c. generator. In the manner which will presently become clear, the left half portion serves as a driver portion of the piezoelectric transformer and the right half portion, as a generator portion.

When the input signal has a driving frequency resonant with a mechanical vibration of the piezoelectric element in the polarization direction, the mechanical vibration is excited in the driver portion as a result of piezoelectric effect of the piezoelectric material. Mechanical energy of the mechanical vibration is converted by the piezoelectric effect to electric energy in the generator portion to generate the output signal. The mechanical vibration has a mode which is depicted bottomwise of the piezoelectric transformer and which has a node centrally of the lengthwise direction and a pair of loops on both lengthwise ends of the piezoelectric transformer or element.

Figure 2:
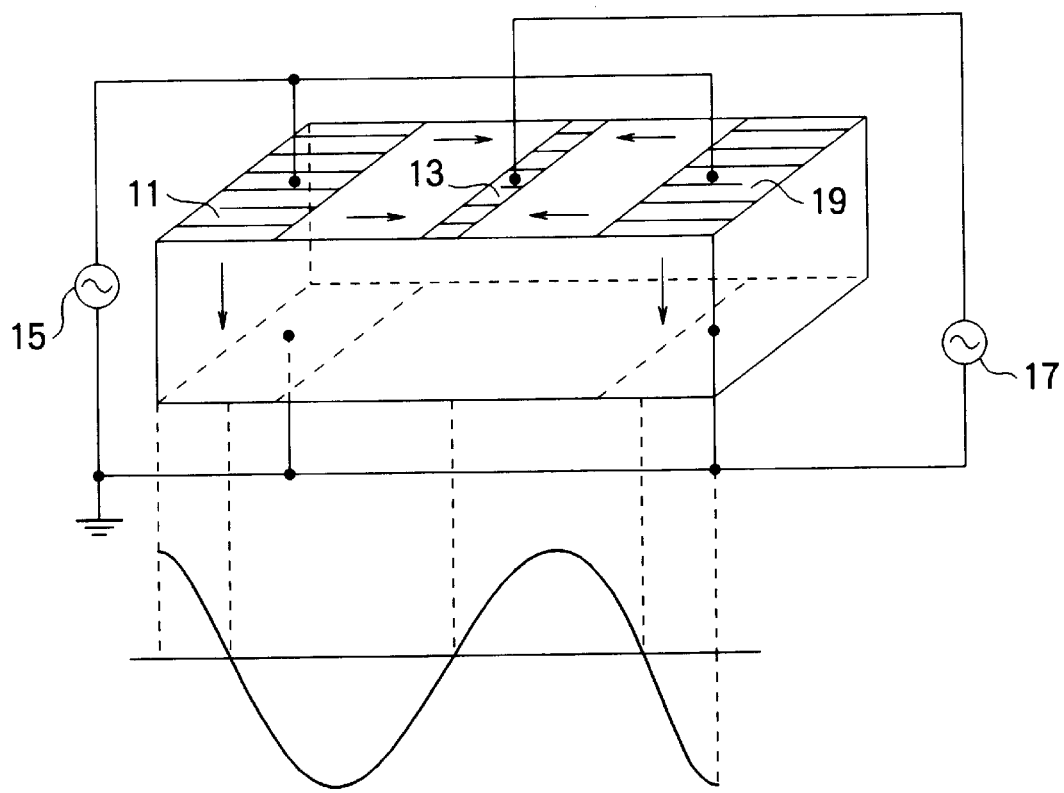
FIG. 2 schematically shows a perspective view of another conventional piezoelectric transformer together with a mode of vibration of a piezoelectric element thereof.

Turning to FIG. 2, another conventional piezoelectric transformer is described also in Japanese Patent Prepublication No. 177,451 of 1994 and is of a third order Rosen type. Similar parts are designated by like reference numerals and are likewise operable.

The piezoelectric transformer comprises a plurality of input terminals, a first pair of input terminals being indicated in common by the reference numeral 11 and disposed at a left side end portion of the piezoelectric element. Another or second pair of input terminals is spaced from each other in the thickness direction at a right side end portion and is designated by a common reference numeral 19. One of the input electrodes 19 of this second pair is used as one of the output electrodes 13, one of which is formed along the widthwise direction centrally of the lengthwise direction.

Between the second pair of input electrodes 19, the piezoelectric element is subjected to the polarization in the polarization direction parallel to that between the first pair of the input electrodes 11 to serve additionally as the driver portion. Between these driver portions, the generator portion is subjected to polarization antiparallel in the lengthwise direction on both sides of the output electrode 13 as indicated by a pair of rightwardly directed arrows and by another pair of leftwardly directed arrows.

When the driver source 15 supplies the input signal across the first pair of input terminals 11 and concurrently across the second pair of input terminals 19, the output electrodes 13 deliver the output signal to the load 17. Meanwhile, the mechanical vibration of the piezoelectric element is of a third order Rosen type and has a center node on an interface between both lengthwise ends of the piezoelectric element, a pair of oppositely vibrating loops at the both lengthwise ends, a pair of left and right nodes on both sides of the center node with a left and a right loop interposed between the center node and the left and the right nodes, respectively.

Figure 3:
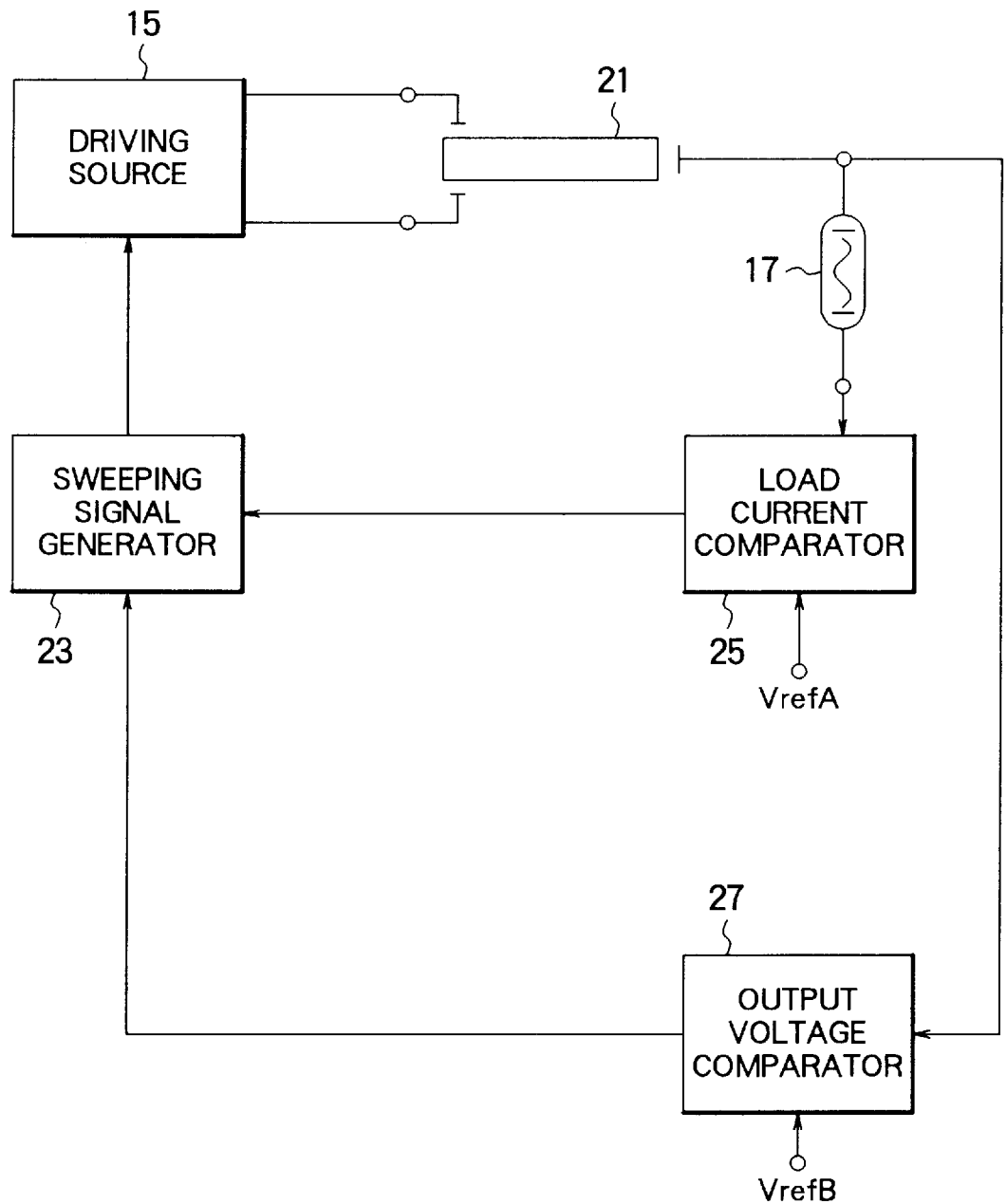
FIG. 3 is a block diagram of an improved driving circuit for a piezoelectric transformer according to prior art.

Further turning to FIG. 3, the description will proceed to an improved driving circuit described in Japanese Patent Prepublication No. 107,678 of 1996 referred to hereinabove. The driving circuit is for use in driving a piezoelectric transformer 21 which may be whichever of those illustrated with reference to FIGS. 1 and 2 and comprises the input terminals and one of the output terminals symbolically depicted in the manner known in the art.

Driven by the driving source 15 of the driving circuit, the piezoelectric transformer 21 supplies the transformer output signal to the load 17 which is a cold cathode-ray tube for providing backlight of a liquid crystal display (not shown). In this instance, the output signal is a serrasoidal signal having a predetermined peak voltage, such as 2 kV, at a sweeping frequency in a predetermined frequency range. In the driving circuit, a sweeping signal generator 23 adjustably controls the driving source 15. Through the load 17, a load current is delivered to a load current comparator 25 supplied with a first reference voltage VrefA to eventually keep the transformer input signal and consequently the output signal in the predetermined frequency range. The output signal is branched to an output voltage comparator 27 which is supplied with a second reference voltage VrefB and controls the driving source 15 through the sweeping signal generator 23 so as to insure that the output voltage would not exceed the predetermined peak voltage.

In this manner, the improved driving circuit avoids the occurrence of damage to the piezoelectric transformer 21 merely by preventing the transformer output signal from rising to an excessive output voltage. It has not been known even in view of Japanese Patent Prepublication No. 4,767 of 1992 cited heretobefore that such a damage would occur from an unbalanced vibration of the piezoelectric element, that such an abnormal vibration can be detected, and that the piezoelectric transformer 21 can produce a different signal other than the transformer output signal.

Figure 4:
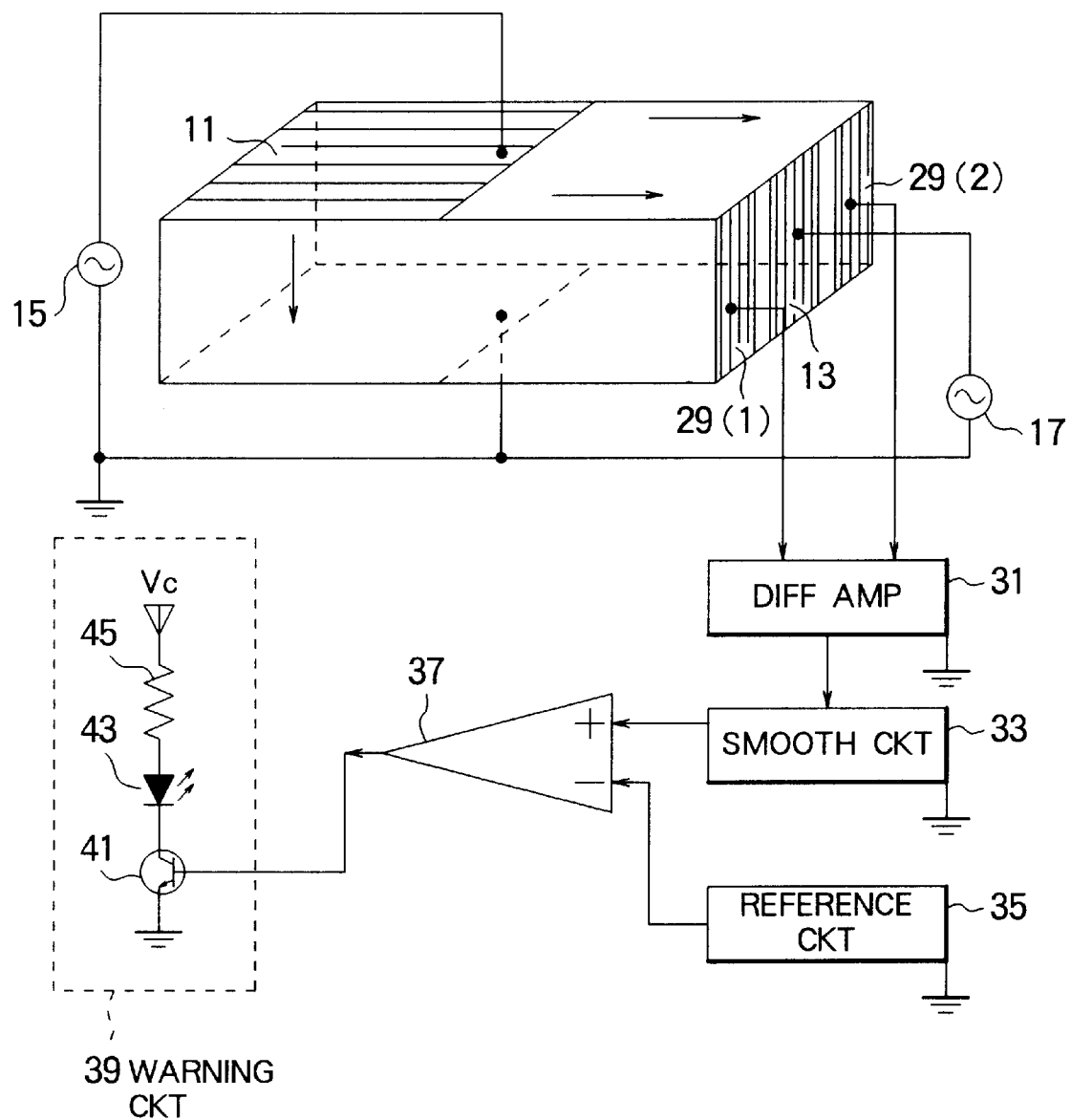
FIG. 4 shows a schematic perspective view of a piezoelectric transformer according to a first embodiment of the instant invention and a block diagram of an abnormal operation detecting circuit for the piezoelectric transformer.

Referring now to FIG. 4, attention will be directed to a piezoelectric transformer according to a first preferred embodiment of this invention and to an abnormal operation detecting circuit according to a preferred embodiment of a different aspect of this invention. Like in FIG. 1, the piezoelectric transformer is of the first order Rosen type. Throughout the following, similar parts are designated by like reference numerals, except for the reference numeral 21, and are likewise operable.

Besides the input electrodes 11 supplied from the driving source 15 with the transformer input signal and an isolated output electrode 13 from which the transformer output signal is delivered to the load 17, the piezoelectric transformer comprises a pair of monitor electrodes 29(1) and 29(2) which are formed by printing the silver-palladium paste on the piezoelectric element followed by subsequent firing and will collectively be indicated by a single reference numeral 29. In the example being illustrated, the isolated output electrode 13 covers the right side end of the piezoelectric element with a pair of relatively wide areas left on both widthwise sides of the isolated output electrode 13. The monitor electrodes 29 are formed symmetrically on the relatively wide areas, respectively.

When the piezoelectric transformer is put in operation, a monitor signal is developed across the monitor electrodes 29 to indicate a state of the mechanical vibration of the piezoelectric element. More particularly, the monitor signal has a zero level while the mechanical vibration is normal. The monitor signal has a certain finite value when the mechanical vibration is abnormal to give rise to an unbalance between vibration components in the lengthwise direction, namely, in the direction of polarization of the generator portion, between adjacencies of the front and the rear surfaces. More in particular, the monitor electrodes 29 can independently indicate the vibration components.

Responsive to the monitor signal, the abnormal operation detecting circuit detects an abnormal operation, such as the unbalance, of the piezoelectric transformer and appearance of a crack in the piezoelectric element. The monitor electrodes 29 separately produce a pair of monitor signal components, which are supplied to a differential amplifier 31 for producing a difference signal dependent on a difference between the monitor signal components. The difference signal is smoothed by a smoothing circuit 33 for producing a smoothed signal representative of a degree of the unbalance. A reference circuit 35 generates a reference signal of a predetermined level. A comparator 37 compares the smoothed signal with the reference signal to produce a comparison result signal representative of a difference of the smoothed signal minus the reference signal.

The predetermined level may indicate that the unbalance is either nearly as great as to give rise to the crack or is about to produce the crack. With the reference signal given such a predetermined level, the comparison result signal is delivered to a warning circuit 39. Only when the smoothed signal is greater than the reference signal, the comparison result signal is used in the warning circuit 39 to turn in a switching element 41 to light a light emitting diode 43 by a warning power Vc through a resistor 45.

In this manner, the abnormal operation detecting circuit comprises comparing means for comparing the monitor signal, namely, the monitor signal components, with the reference signal to produce a warning signal, as by light of the light emitting diode 43, when the state of operation is objectionable. Responsive to the warning signal, it is possible to stop further use of the piezoelectric transformer and to substitute a new piezoelectric transformer for the piezoelectric transformer which has fallen into an objectionable state.

Figure 5:
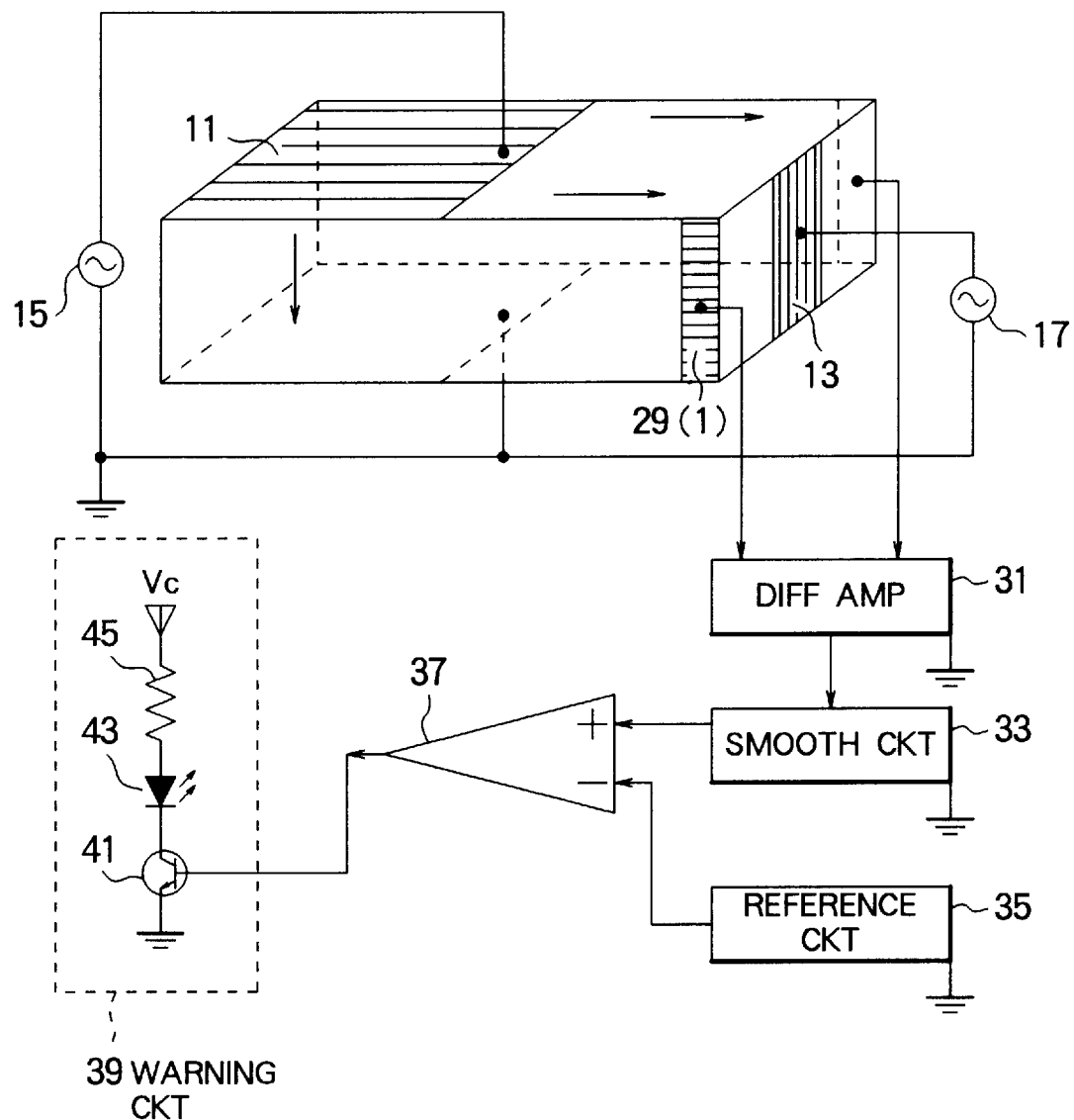
FIG. 5 shows a schematic perspective view of a piezoelectric transformer according to a second embodiment of this invention and an abnormal operation detecting circuit similar to that illustrated in FIG. 4.

Turning to FIG. 5, the description will proceed to a piezoelectric transformer according to a second preferred embodiment of this invention. The piezoelectric transformer is again of the first order Rosen type.

The isolated output electrode 13 covers the right side end of the piezoelectric element with a pair of narrow areas left on both widthwise sides of the isolated output electrode 13. The monitor electrodes 29 are formed symmetrically on the front and the rear surfaces near the right side end.

The monitor signal components are now indicative of an unbalance, if any, between vibration components in the widthwise direction between adjacencies of the front and the rear surfaces. In other words, the monitor signal components can indicate fear of appearance of a crack in the piezoelectric element orthogonally of the direction of the polarization in the generator portion. More in detail, the monitor signal components can independently indicate such cracks which may appear parallel to and in adjacencies of the front and the rear surfaces. The abnormal operation detecting circuit is not different from that illustrated with reference to FIG. 4. This applies to examples which will be described below as regards the piezoelectric transformer.

Figure 6:
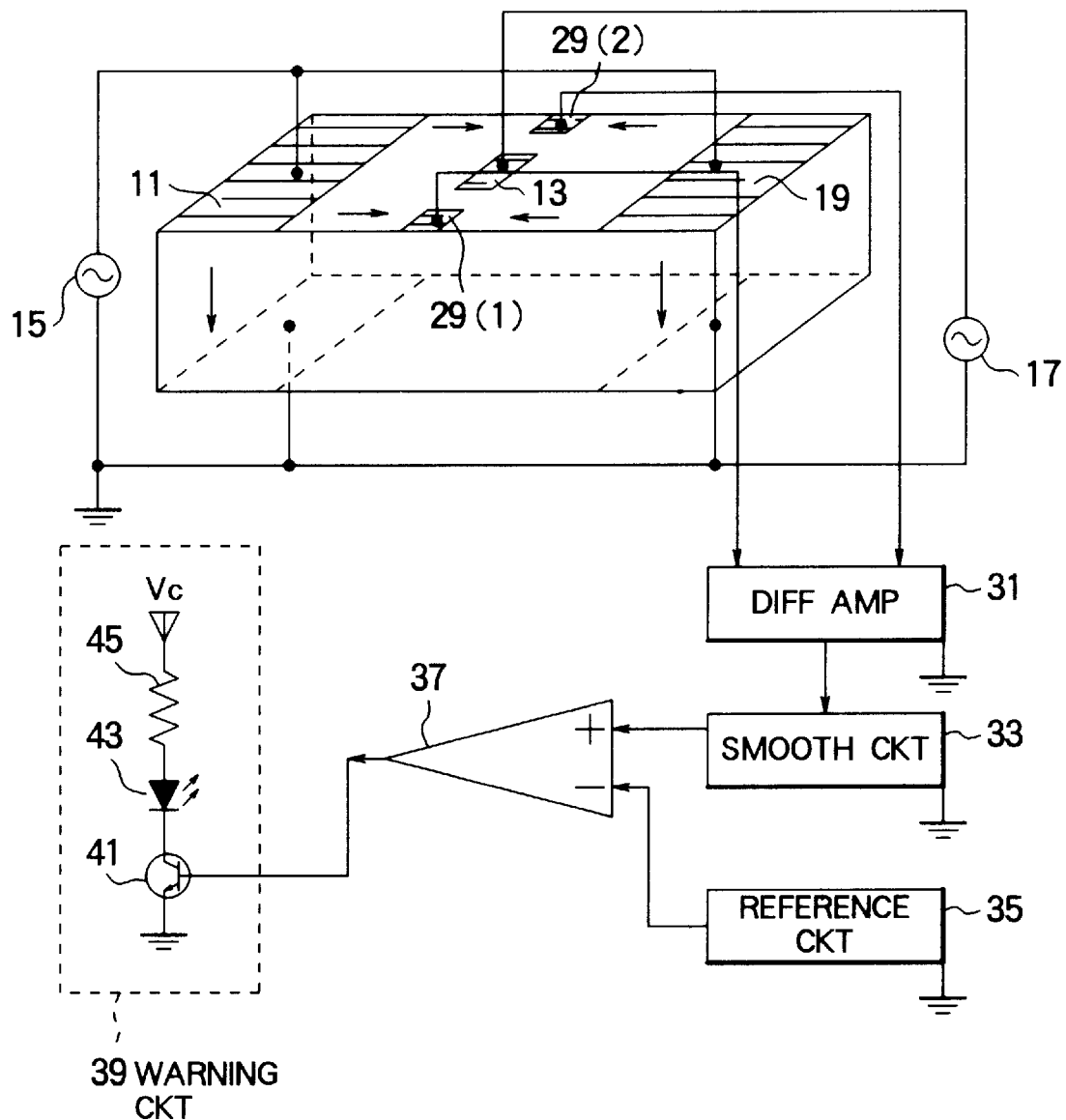
FIG. 6 shows a schematic perspective view of a piezoelectric transformer according to a third embodiment of this invention and an abnormal operation detecting circuit similar to that depicted in FIG. 4.

Referring afresh to FIG. 6, the description will be directed to a piezoelectric transformer according to a third preferred embodiment of this invention. This piezoelectric transformer is of the third order Rosen type.

Like in FIG. 2, the input terminals 11 of the first pair are spaced apart in the thickness direction near the left side end of the piezoelectric element with the input electrodes 19 of the second pair similarly formed near the right side end and with one each of the input electrodes 11 and the input electrodes 19 used in common as one of the output electrodes 13. The isolated output electrode 13 is formed in the widthwise direction centrally of the lengthwise direction and, here, symmetrically leaving relatively widthwise long spaces on both ends thereof. The monitor electrodes 29 are formed in these relatively widthwise long spaces, respectively.

The monitor signal components are produced to indicate an unbalance, if any, in the mechanical vibration in the lengthwise direction between adjacencies of the front and the rear surfaces. More specifically, the monitor signal components are capable of detecting cracks which may appear at and adjacent to an interface where the generator portion is subjected to polarization in opposite directions, namely, where the isolated output electrode 13 and the monitor electrodes 29 are formed.

Figure 7:
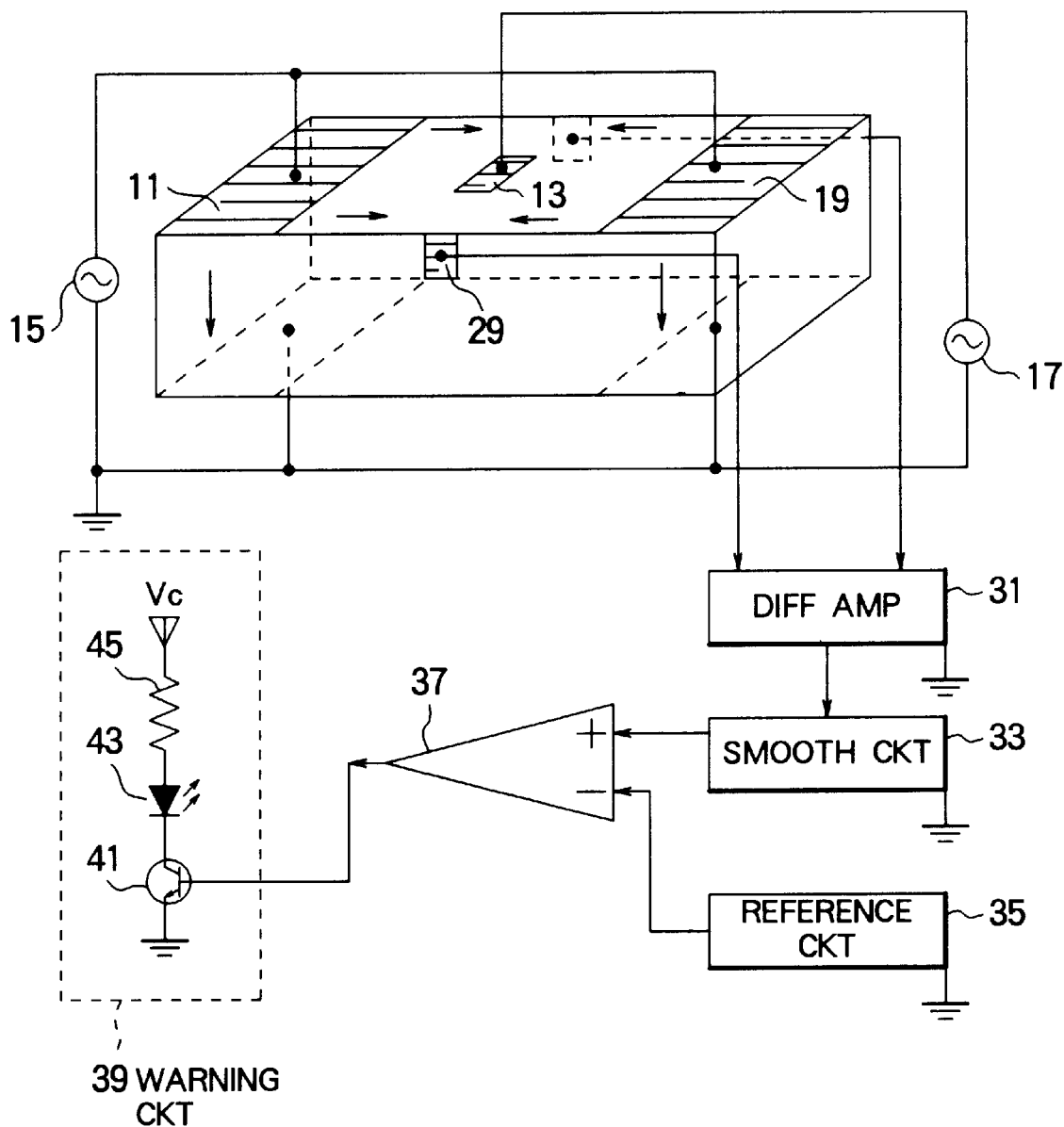
FIG. 7 shows a schematic perspective view of a piezoelectric transformer according to a fourth embodiment of this invention and a block diagram of an abnormal operation detecting circuit similar to that illustrated in FIG. 4.

Turning to FIG. 7, attention will be directed to a piezoelectric transformer according to a fourth embodiment of this invention. This piezoelectric transformer is again of the third order Rosen type.

The isolated output electrode 13 is formed like in FIG. 6 except that narrow gaps are symmetrically left between both ends of the isolated output electrode 13 and the front and the rear surfaces. Like in FIG. 4, the monitor electrodes 29 are formed on the front and the rear surfaces adjacent to a top surface of the piezoelectric element where the isolated output electrode 13 is placed.

The monitor signal components can indicate an unbalance in the mechanical vibration in the widthwise direction between adjacencies of the front and the rear surfaces. As a consequence, the monitor signal components can independently indicate cracks which may appear orthogonal to the direction of polarization in the generator portion in the adjacencies of the front and the rear surfaces.

While this invention has thus far been described in specific conjunction with a plurality of piezoelectric transformer according to several preferred embodiments thereof and an abnormal operation detecting circuit for use in common to these piezoelectric transformers, it will now be readily possible for one skilled in the art to carry this invention into effect in various other manners. For example, it is possible to make a piezoelectric transformer comprise a plurality of pairs of monitor electrodes 29, such as those described with reference to FIGS. 4 and 5 or in connection with FIGS. 6 and 7. In each piezoelectric transformer, the piezoelectric element may have a greater measure in the widthwise direction than in the lengthwise direction. In the manner depicted in FIG. 7, the monitor electrodes 29 may cover the front and the rear surfaces in the example being illustrated only their portions adjacent to a top surface of the piezoelectric element.

It is possible to make the abnormal operation monitoring circuit comprise, a comparator 37 for comparing a predetermined level of the type generated by the reference circuit 35 with a smoothed signal derived from each monitor signal component rather than from the difference signal produced by the difference amplifier 31. It is furthermore possible to additionally use the driving circuit described in conjunction with FIG. 3.

What is claimed is:

1. A piezoelectric transformer comprising; a piezoelectric element and a plurality of power electrodes on said piezoelectric element subjecting said piezoelectric element to polarization, driving said piezoelectric element by a transformer input signal, and providing a transformer output signal; and a plurality of monitor electrodes offset from said power electrodes on said piezoelectric element monitoring unbalanced vibration of said piezoelectric element.

2. The piezoelectric transformer as claimed in claim 1, wherein said monitor electrodes produce a pair of monitor signal components indicative of the unbalanced vibration.

3. The piezoelectric transformer as claimed in claim 2, said piezoelectric element being a rectangular column having a lengthwise, a widthwise, and a thickness direction orthogonal to each other, first and second end surfaces parallel to said widthwise and said thickness directions, and front and rear surfaces parallel to said lengthwise and said thickness directions, wherein said monitor electrodes provide said monitor signal components individually indicating cracks in said piezoelectric element in said lengthwise direction near said front and said rear surfaces, respectively, while said piezoelectric element is driven by said transformer input signal to produce said transformer output signal.

4. The piezoelectric transformer as claimed in claim 3, said power electrodes comprising a pair of input electrodes spaced apart in said thickness direction on said piezoelectric element contiguous to said first end surface for said transformer input signal and an isolated output electrode on said second end surface that is one of a pair of output electrodes for said transformer output signal; wherein one of said input electrodes is also the other of said output electrodes, wherein said monitor electrodes comprise a pair of monitor electrodes on said second end surface contiguous to said front and said rear surfaces and isolated from said isolated output electrodes, with said isolated output electrode being spaced from said front and said rear surfaces for positioning of said pair of monitor electrodes.

5. The piezoelectric transformer as claimed in claim 3, said power electrodes comprising first and second pairs of input electrodes spaced apart in said thickness direction on said piezoelectric element contiguous to said first and said second end surfaces, respectively, for said transformer input signal, and an isolated output electrode extending in said widthwise direction centrally between said first and said second end surfaces and coplanar with ones of the input electrodes of said first and said second pairs that is also one of a pair of output electrodes for said transformer output signal with one of the input electrodes of each of said first and said second pairs being the other of said output electrodes, wherein said monitor electrodes comprise a pair of monitor electrodes which are extending colinear with and isolated from said isolated output electrode and which have one-side ends at said front and said rear surfaces, respectively.

6. The piezoelectric transformer as claimed in claim 2, said piezoelectric element being a rectangular column having a lengthwise, a widthwise, and a thickness direction orthogonal to each other, first and second end surfaces parallel to said widthwise and said thickness directions, and front and rear surfaces parallel to said lengthwise and said thickness directions, wherein said monitor electrodes provide said monitor signal components individually indicating cracks in said piezoelectric element in said widthwise direction near said front and said rear surfaces, respectively, while said piezoelectric transformer is driven by said transformer input signal to produce said transformer output signal.

7. The piezoelectric transformer as claimed in claim 6, said power electrodes comprising a pair of input electrodes spaced apart in said thickness direction on said piezoelectric element contiguous to said first end surface for said transformer input signal and an isolated output electrode on said second end surface that is one of a pair of output electrodes for said transformer output signal; wherein one of said input electrodes is also the other of said output electrodes, wherein said monitor electrodes comprise a pair of monitor electrodes on said front and said rear surfaces contiguous to said second end surface and isolated from said isolated output electrode.

8. The piezoelectric transformer as claimed in claim 6, said power electrodes comprising first and second pairs of input electrodes spaced apart in said thickness direction on said piezoelectric element contiguous to said first and said second surfaces, respectively, for said transformer input signal, and an isolated output electrode extending in said direction centrally between said first and said second end surfaces and coplanar with ones of the input electrodes of said first and said second pairs that is also one of a pair of output electrodes for said transformer output signal with one of the input electrodes of each of said first and said second pairs being the other of said output electrodes, wherein said monitor electrodes comprise a pair of monitor electrodes on said front and said rear surfaces on an extension of said isolated electrode onto said front and said rear surfaces and isolated from said isolated output electrode.

9. The transformer of claim 1, wherein said plurality of monitor electrodes comprises a pair of said monitor electrodes that are symmetrically positioned relative to one of said power electrodes that provides the transformer output signal, and further comprising a differential amplifier connected to said pair of monitor electrodes for producing a difference signal indicating a difference between responses of said pair of monitor electrodes that is indicative of the unbalanced vibration of said piezoelectric element, a smoothing circuit for smoothing the difference signal, and a comparator connected to said smoothing circuit and to a reference signal for indicating the unbalanced vibration.

10. An abnormal operation detecting circuit and a piezoelectric transformer, comprising a piezoelectric element, a plurality of input electrodes for a transformer input signal, a pair of output electrodes for a transformer output signal, and a plurality of monitor electrodes for individually producing monitor signal components collectively as a monitor signal indicative of an unbalanced vibration of said piezoelectric element, and comparing means for comparing said monitor signal with a reference signal to produce a difference signal when the unbalanced vibration is objectionable.

11. The abnormal operation detecting circuit as claimed in claim 10, said piezoelectric transformer comprising an isolated output electrode that is one of said pair of output electrodes, wherein one of said plurality of input electrodes is also the other of said pair of output electrodes, wherein said plurality of monitor electrodes comprise a pair of said monitor electrodes disposed on said piezoelectric transformer symmetrically relative to said isolated output electrode, wherein said comparing means comprises:

a differential amplifier responsive to the monitor signal components produced by said pair of monitor electrodes producing a difference signal;

a smoothing circuit smoothing said difference signal into a smoothed signal; and a comparator comparing said smoothed signal with said reference signal and indicating by said difference signal the unbalanced vibration caused in said piezoelectric transformer by said transformer input signal near said pair of monitor electrodes.

12. A piezoelectric transformer with an abnormal operation detecting circuit, comprising:

a piezoelectric element;

transformer input electrodes connected to said piezoelectric element;

transformer output electrodes connected to said piezoelectric element;

a pair of monitor electrodes connected to said piezoelectric element, said pair of monitor electrodes being positioned symmetrically relative to one of said output electrodes;

a differential amplifier connected to said pair of monitor electrodes for producing a difference signal indicating a difference between responses of said monitor electrodes that is indicative of abnormal operation of said transformer;

a smoothing circuit for smoothing the difference signal; and a comparator connected to said smoothing circuit and to a reference signal to indicate an abnormal operation of the transformer.

13. The transformer of claim 12, wherein said one of said output electrodes is one of a pair of said output electrodes and the other of said pair of output electrodes is also one of said input electrodes.

14. The transformer of claim 12, wherein the difference signal from said differential amplifier indicates an unbalanced vibration of said piezoelectric element.

* * * * *